United States Patent [19]
Lee

[11] Patent Number: 5,966,420
[45] Date of Patent: Oct. 12, 1999

[54] COUNTER CIRCUIT FOR EMBODYING LINEAR BURST SEQUENCE

[75] Inventor: Sang Ho Lee, Kyoungki-do, Rep. of Korea

[73] Assignee: Hyundai Electronics Industries Co., Ltd., Kyoungki-do, Rep. of Korea

[21] Appl. No.: 08/908,571

[22] Filed: Aug. 8, 1997

[30] Foreign Application Priority Data

Aug. 8, 1996 [KR] Rep. of Korea ...................... 96-33058

[51] Int. Cl.⁶ ................................................. H03K 21/00
[52] U.S. Cl. .............................................................. 377/33
[58] Field of Search .................................................. 377/33

[56] References Cited

U.S. PATENT DOCUMENTS

| | | | |
|---|---|---|---|
| 4,912,630 | 3/1990 | Cochcroft, Jr. ........................ | 364/200 |
| 5,805,523 | 9/1998 | Lysinger .............................. | 365/230.08 |
| 5,835,970 | 11/1998 | Landry et al. .......................... | 711/218 |

*Primary Examiner*—Margaret R. Wambach
*Attorney, Agent, or Firm*—Jacobson, Price, Holman & Stern, PLLC

[57] ABSTRACT

A counter circuit uses a plurality of counter circuits so as to be used in all products employing a counter circuit in a semiconductor device, and thereby performs a multi-bit linear burst sequence operation. The counter circuit for embodying a linear burst sequence includes: a low order counting means which responds to an external clock signal and an external counting control signal, receives and counts a least significant first bit data among base input signals having bits ranging from a first bit to a N-th bit, and then generates a first data signal and a first high order control signal; and a plurality of high order counting means which receive bits ranging from a second bit successively connected to the least significant first bit to N-th bit, perform a counting operation, and generate a second data signal and a second high order control signal. The high order counting means which responds to the high order control signal and the counting control signal which are generated from the high order counting means of a previous bit of a present input bit, performs a counting operation, and outputs data signal.

9 Claims, 3 Drawing Sheets

COUNTER CIRCUIT FOR EMBODYING LINEAR BURST SEQUENCE

BACKGROUND OF THE INVENTION

1. Field of the Invention

The present invention generally relates to a counter circuit. More particularly, it relates to a counter circuit which uses a plurality of counter circuits so as to be used in all products employing a counter circuit in a semiconductor device, and thereby performs a multi-bit linear burst sequence operation.

2. Description of the Conventional Art

FIG. 1 shows a conventional counter circuit. The conventional counter circuit generates a clock synchronizing sign 1 CNT_CLOCK for synchronizing a counting operation. The low level bit counter and high level bit counter are responsive to the clock synchronizing signal CNT_CLOCK changing from a low level signal L to a high level signal H, or from a high level signal H to a low level signal L. The low order bit counter generates a first output signal OUT0 which is high(H)→low(L)→high (H)→low(L). The high order bit counter responds to the output signal of the low order bit counter and then generates a second output signal OUT1 being low(L)→low(L)→high(H)→high(H)→low(L)→low (L)→high(H)→high(H).

The conventional counter circuit does not receive an input signal (e.g., address, etc.) that functions as a base signal in a linear burst sequence operation. Accordingly, the conventional counter circuit cannot make an output signal according to the linear burst operation based on the input signal, and thus cannot be used in a device having the linear burst sequence operation.

SUMMARY OF THE INVENTION

Accordingly, the present invention is directed to a counter circuit for embodying a linear burst sequence that substantially obviates one or more of the problems due to limitations and disadvantages of the conventional art.

It is an objective of the present invention to provide a counter circuit for a linear burst sequence operation which uses a plurality of counter circuits so as to be used in all products employing a counter circuit in a semiconductor device, and thereby performs a multi-bit linear burst sequence operation.

To achieve the above objective, a counter circuit for embodying a linear burst sequence includes a low order counting means and a plurality of high order counting means.

The low order counting means responds to a clock signal and a counting control signal, receives and counts a least significant first bit data among base input signals having bits ranging from a first bit to a N-th bit, and then generates a first data signal and a first high order control signal.

The plurality of high order counting means receive bits ranging from a second bit successively connected to the least significant first bit to N-th bit, perform a counting operation, and generate a second data signal and a second high order control signal.

Each high order counting means responds to both the high order control signal which is generated from the high order counting means of a previous bit of a present input bit and the counting control signal, and performs a counting operation.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE INVENTION

The preferred embodiment of the present invention will become apparent from a study of the following detailed description, when viewed in light of the accompanying drawings.

Figure 1:
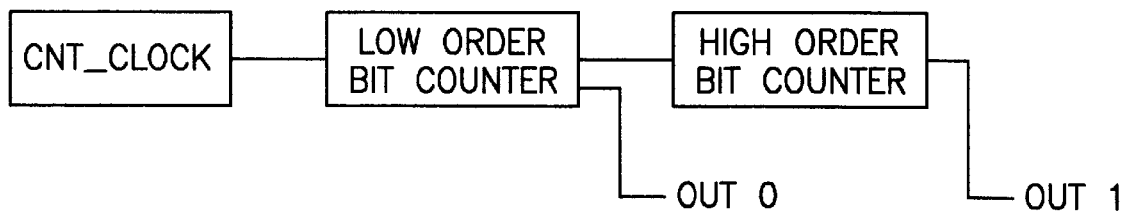
FIG. 1 is a block diagram illustrating a conventional counter circuit.
Figure 2:
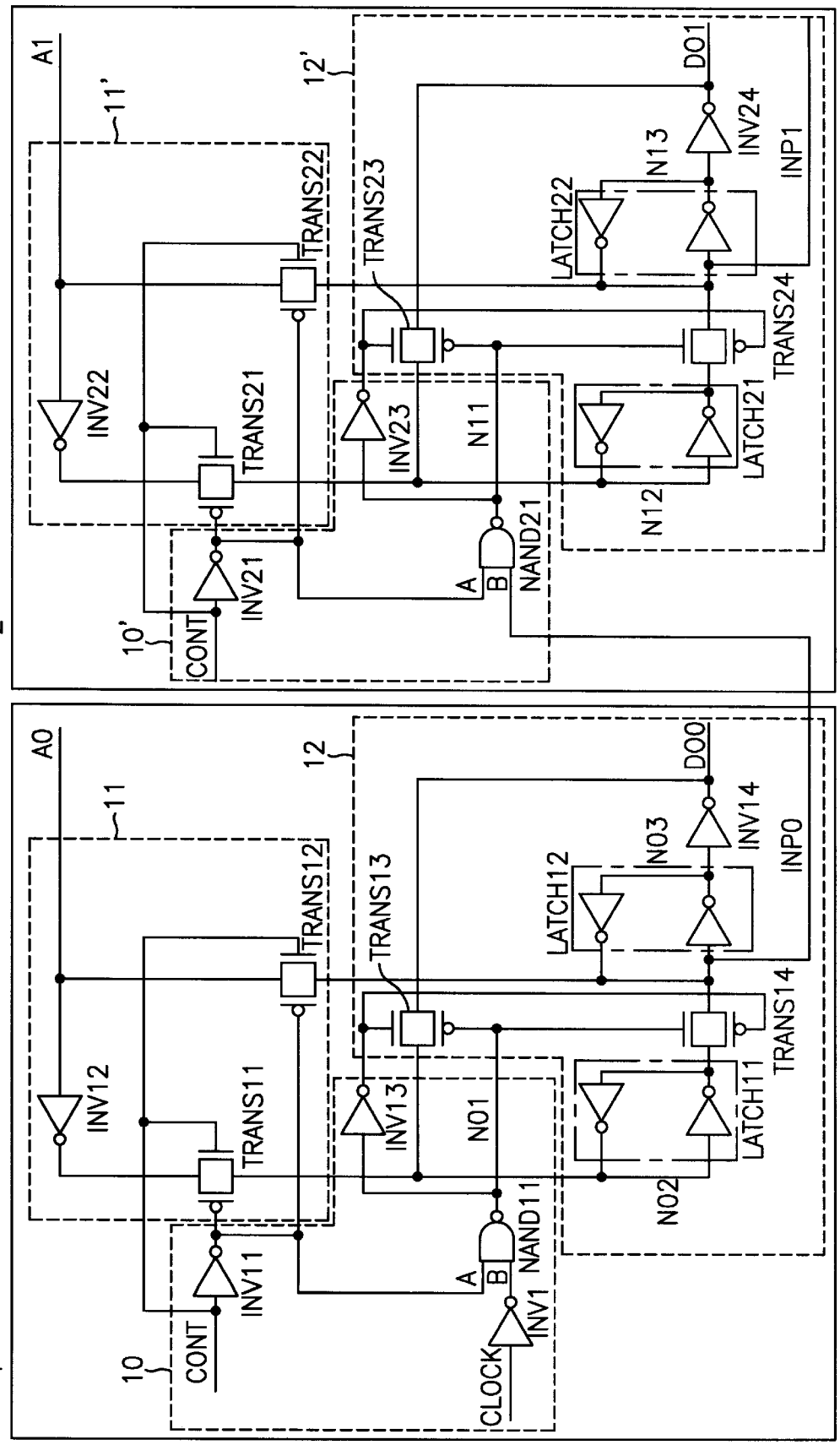
FIG. 2 is a logic circuit illustrating a counter circuit for embodying 2-bit linear burst sequence in accordance with a preferred embodiment of the present invention.

FIG. 2 is a counter circuit embodying 2-bit linear burst sequence in accordance with a preferred embodiment of the present invention. The counter circuit includes a first low order bit counter circuit 1 for counting a low order bit, and a second high order bit counter circuit 2 for counting a high order bit.

The first low order bit counter circuit 1 includes three main elements: a first controller 10, a first data input portion 11 and a first output portion 12.

The first controller 10 receives a clock pulse signal CLOCK and a counter enable signal CONT applied from the outside, and controls a counting operation by combining the signals CLOCK and CONT.

The first data input portion 11 responds to a control of the first controller 10, and receives a low order input signal A0 to perform a counting operation from the outside.

The first output portion 12 counts an input data from the first data input portion 11 by responding to the control of the first controller 10, and generates a first data signal D00 and a first high order control signal INP0 controlling a high order bit counting.

The first data input portion 11 includes a first transmission gate TRANS11 and a second transmission gate TRANS12 which receive the counter enable signal CONT from the first controller 10 as a gate input.

The first controller 10 includes a NAND gate NAND11 for performing a NAND operation about the clock pulse signal CLOCK and the counter enable signal CONT.

The first output portion 12 includes a third transmission gate TRANS13, a first latch LATCH11, a fourth transmission gate TRANS14 and a second latch LATCH12.

The third transmission gate TRANS13 receives an output signal from the first controller 10 as a gate input, and passes the output data from the first data input portion 11.

The first latch LATCH11 latches the output data of the first data input portion 11.

The fourth transmission gate TRANS14 receives an output signal from the first controller 10 as a gate input, and passes the output signal from the first latch LATCH11.

The second latch LATCH12 latches an output signal of the fourth transmission gate TRANS14.

The second high order bit counter circuit 2 includes three primary elements: a second controller 10'; a second data input portion 11' and a second output portion 12'.

The second controller 10' receives a first high order control signal INP0 input from the first low order bit counter circuit 1 and the external counter enable signal CONT. The second controller 10' controls a counting operation by combining the signals INP0 and CONT.

The second data input portion 11' receives a high order input signal A1 to perform a counting operation from the outside by responding to a control of the second controller 10'.

The second output portion 12' counts an input data from the second data input portion 11' by responding to the control of the second controller 10', and generates a second data signal D01 and a second high order control signal INP1.

Each internal structure of the second high order bit counter circuit 2 is the same as the respective structure of the first low order bit counter circuit 1.

The external counter enable signal CONT controls the first low order bit counter circuit 1 and the second high order bit counter circuit 2. When the high level signal CONT is input to the circuits 1 and 2, the high level signal is inverted by passing through a first inverter INV11 and a fifth inverter INV21. A low level signal which is an inverted signal of the high level signal is input to the first data input portion 11 and the second data input portion 11'. The low level signal is input to gate terminals of the first transmission gate TRANS11 and the fifth transmission gate TRANS21 and to gate terminals of a second transmission gate TRANS12 and a sixth transmission gate TRANS22. Thus, the low level signal turns on the first, fifth, second and sixth transmission gates.

A low level input signal, on the other hand, is input to a first NAND gate NAND11 and a second NAND gate NAND21. Therefore, the output signals of the first NAND gate NAND11 and the second NAND gate NAND21 are at a high level due to the NAND operation. This high level is input to gate terminals of a third transmission gate TRANS13 and a seventh transmission gate TRANS23. The high level is also input to gate terminals of a fourth transmission gate TRANS14 and an eighth transmission gate TRANS24. Thereby, the third, seventh, fourth and eighth transmission gates are turned off. In this case, if the low order input signal A0 and the high order input signal A1 which have a low level are input to the portions 11 and 11', the first transmission gate TRANS11 and the second transmission gate TRANS12 are turned on. Accordingly, the signal INP0 generated from the first low order bit counter circuit 1, the first data signal D00 applied to a data bus line, the fifth transmission gate TRANS21 and the sixth transmission gate TRANS22 are tuned on. Thus a signal INP1 from the second high order bit counter circuit 2 and a second data signal D01 applied to a data bus line receive the input signal of low level as an output signal without any change, and are thus to be a low level signal.

If the external counter enable signal CONT is at a low level, this low level signal is inverted via the first inverter INV11 and the fifth inverter INV21. A high level signal, which is an inverted signal of the low level signal, is input to gate terminals of the first transmission gate TRANS11 and the fifth transmission gate TRANS21. This high level signal is also input to gate terminals of the second transmission gate TRANS12 and the sixth transmission gate TRANS22. Accordingly, the first, fifth, second, and sixth transmission gates are turned off. A high level signal is input to the first NAND gate NAND11 and the second NAND gate NAND21 as an input signal A, and the outputs of the first and second NAND gates NAND11 and NAND21 are determined according to the other input signal B. This input signal B is the clock pulse signal CLOCK for synchronizing a counting clock after being applied from the outside. Herein, the input signal B of the first NAND gate NAND11 is an inverted signal of the clock pulse signal CLOCK having a constant period.

Figure 3:
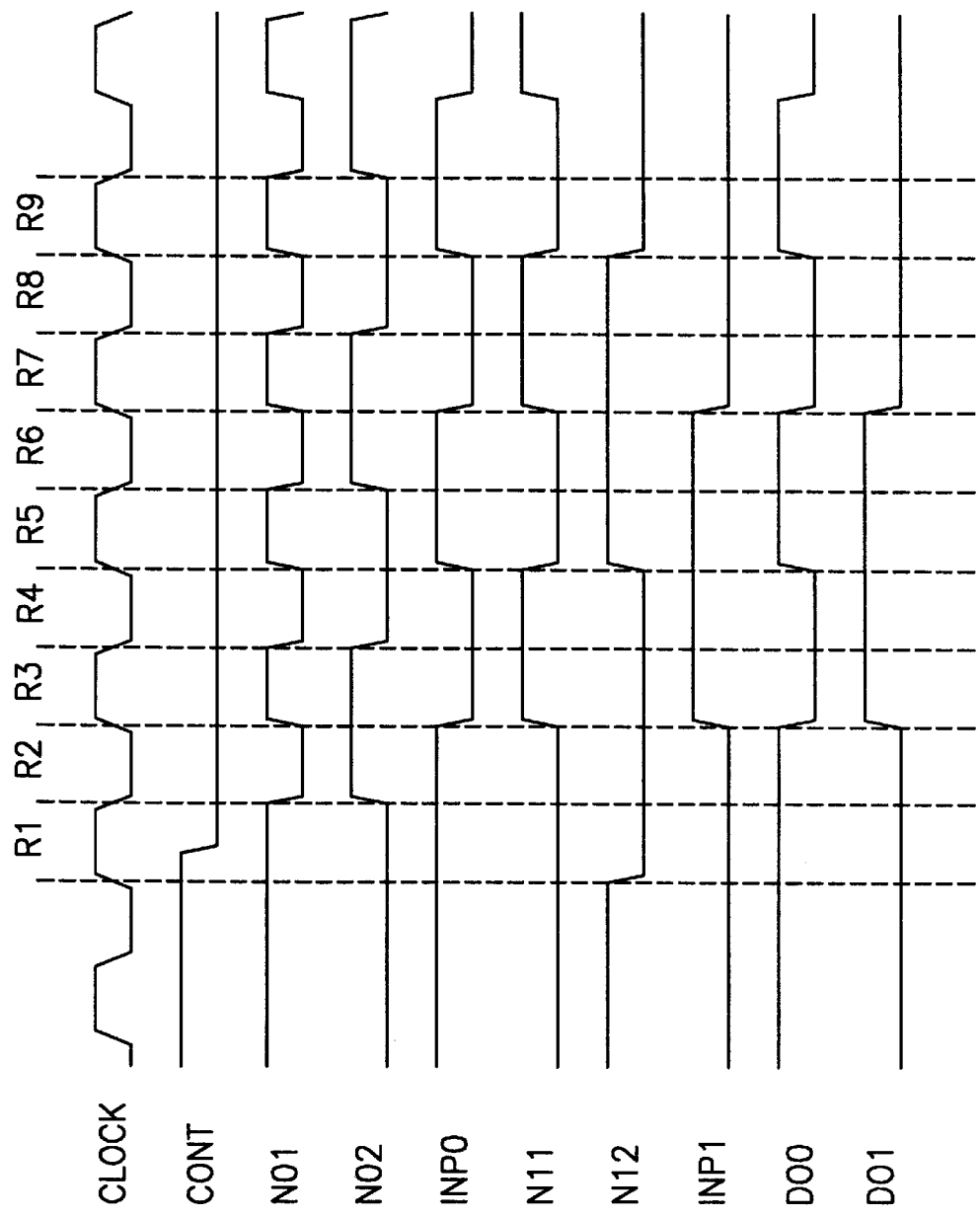
FIG. 3 is a timing diagram illustrating a timing about a signal in each area of the counter circuit for embodying 2-bit linear burst sequence shown in FIG. 2 in accordance with a preferred embodiment of the present invention.

FIG. 3 is a timing diagram illustrating timings when the low order input signal A0 is at a high level and the high order input signal A1 is at a low level.

Referring to FIG. 3, if a counter enable signal CONT having a high level is input to the circuits 1 and 2 shown in FIG. 2, the first transmission gate TRANS11, the fifth transmission gate TRANS21, the second transmission gate TRANS12 and the sixth transmission gate TRANS22 are turned on, the third transmission gate TRANS13 and the seventh transmission gate TRANS23 are turned off, and the fourth transmission gate TRANS14 and the eighth transmission gate TRANS24 are tuned on, and therefore a signal INP0 is at a low level like the high order input signal A1.

At a first interval R1, the external clock pulse signal CLOCK is a high level signal and the counter enable signal CONT for controlling the counter circuit is a low level signal. Herein, the first transmission gate TRANS11, the fifth transmission gate TRANS21, the second transmission gate TRANS12 and the sixth transmission gate TRANS22 are tuned off, so that the signals INP0 and INP1 maintain a previous status value. That is, the signal INP0 maintains a high level signal, and the signal INP1 maintains a low level signal. In addition, states of the first data signal D00 and the second data signal D01 are not changed in the first interval R1. In this case, a low level signal is input to a node N11 because the signal INP0 is at a high level, the seventh transmission gate TRANS23 is turned on by the low level signal generated from the node N11, and the eighth transmission gate TRANS24 is turned off. Accordingly, the low level signal of the second data signal D01 is input to a node N12.

At a second interval R2, the external clock pulse signal CLOCK is changed from the high level to a low level, and the counter enable signal CONT is at a low level. Herein, the fourth transmission gate TRANS14 is turned off and the third transmission gate TRANS13 is turned on, so that a high level signal which is a previous value of the first data signal D00 is input to a node N02. At this time, the signal INP0 maintains a high level state continually, and there is no change in the second high order bit counter circuit 2. The first data signal D00 maintains a high level, and the second data signal D01 maintains a low level, that is, they maintain their previous value continually.

At a third interval R3, the external clock pulse signal CLOCK is changed from the low level to a high level, and the counter enable signal CONT maintains a low level continually. Herein, the third transmission gate TRANS13 is turned off and the fourth transmission gate TRANS14 is turned on. Accordingly, the signal INP0 generates a low level by receiving the inverted value of the node N02, and the first data signal D00 is also at a low level. A high level signal is input to the node N11 because the signal INP0 is at a low level, the seventh transmission gate TRANS23 is turned off by the high level signal from the node N11, and the eighth transmission gate TRANS24 is turned on. The eighth transmission gate TRANS24 receives a value of the node N12 and outputs a high level signal. The second data signal D01 is a high level signal.

At a fourth interval R4, the external clock pulse signal CLOCK is changed from a high level to a low level, and the counter enable signal CONT is at a low level continually. Herein, the fourth transmission gate TRANS14 is turned off and the third transmission gate TRANS13 is turned on, so that a low level signal which is a previous value of the first data signal D00 is input to the node N02. At this time, the signal INP0 maintains a low level signal continually, and there is no change in the second high order bit counter circuit 2. The first data signal D00 maintains a low level signal, and the second data signal D01 maintains a high level signal, that is, they maintain their previous value continually.

At a fifth interval R5, the external clock pulse signal CLOCK is changed from the low level to a high level, and the counter enable signal CONT maintains a low level continually. Herein, the third transmission gate TRANS13 is turned off and the fourth transmission gate TRANS14 is turned on. Accordingly, the signal INP0 generates a high level by receiving the inverted value of the node N02, and the first data signal D00 is also a high level. The node N11 is a low level signal because the signal INP0 is at a high level, the seventh transmission gate TRANS23 is turned on by the low level signal from the node N11, and the eighth transmission gate TRANS24 is turned off. Therefore, a high level signal which is a previous value of the second data signal D01 is input to a node N12, and the signal INP1 and the second data signal D01 maintain their previous high level signal.

At a sixth interval R6, the external clock pulse signal CLOCK is changed from a high level to a low level, and the counter enable signal CONT is at a low level continually. Herein, the fourth transmission gate TRANS14 is turned off and the third transmission gate TRANS13 is turned on, so that a high level signal, which is a previous value of the first data signal D00, is input to the node N02. At this time, the signal INP0 maintains a high level signal continually, and there is no change in the second high order bit counter circuit 2. The first data signal D00 maintains a high level signal, and he second data signal D01 maintains a high level signal, that is, they maintain their previous value continually.

At a seventh interval R7, the external clock pulse signal CLOCK is changed from the low level to a high level, and the counter enable signal CONT maintains a low level continually. Herein, the third transmission gate TRANS13 is turned off and the fourth transmission gate TRANS14 is turned on. Accordingly, the signal INP0 generates a low level by receiving the inverted value of the node N02, and the first data signal D00 is also a low level signal. At this time, the node N11 is a high level signal because the signal INP0 is at a low level, the seventh transmission gate TRANS23 is turned off, and the eighth transmission gate TRANS24 is turned on. Therefore, a signal INP1 generates a low level signal by receiving the inverted value of the node N12, and the second data signal D01 having a low level is generated.

At an eighth interval R8, the external clock pulse signal CLOCK is changed from a high level to a low level, and the counter enable signal CONT is at a low level continually. Herein, the third transmission gate TRANS13 is turned on and the fourth transmission gate TRANS14 is turned off, so that a low level signal, which is the previous value of the first data signal D00, is input to the node N02. At this time, the signal INP0 maintains a low level signal continually, and there is no change in the second high order bit counter circuit 2. The first data signal D00 maintains a low level signal, and the second data signal D01 maintains a low level signal, that is, they maintain their previous value continually.

At a ninth interval R9, the external clock pulse signal CLOCK is changed from a low level to a high level, and the counter enable signal CONT is at a low level continually. Herein, the third transmission gate TRANS13 is turned off and the fourth transmission gate TRANS14 is turned on, a signal INP0 generates a high level signal by receiving the inverted value of the node N02, and the first data signal D00 having a high level is generated. The node N11 is a low level signal because the signal INP0 is at a high level, the seventh transmission gate TRANS23 is turned on by the low level signal from the node N11, the eighth transmission gate TRANS24 is turned off, and thus the low level signal of the second data signal D01 is input to the node N12.

Operations from the first interval R1 to the ninth interval R9 correspond to the clock pulse signal CLOCK from an input signal to be counted and the counter enable signal CONT for controlling a counting of the counter circuit, and successively output the counted data signals. Each procedure is shown in the following table 1.

TABLE 1

|  | A0=LOW A1=LOW | | A0=HIGH A1=HIGH | | A0=LOW A1=LOW | | A0=HIGH A1=HIGH | |
|---|---|---|---|---|---|---|---|---|
|  | D01 | D00 | D01 | D00 | D01 | D00 | D01 | D00 |
| CYCLE 1 | 0 | 0 | 0 | 1 | 1 | 0 | 1 | 1 |
| CYCLE 2 | 0 | 1 | 1 | 0 | 1 | 1 | 0 | 0 |
| CYCLE 3 | 1 | 0 | 1 | 1 | 0 | 0 | 0 | 1 |
| CYCLE 4 | 1 | 1 | 0 | 0 | 0 | 1 | 1 | 0 |

In the aforementioned linear burst sequence counter circuit, a signal INP0 and a first data signal from the low order bit counter circuit 1 are changed when the clock pulse signal is changed from a low level signal to a high level signal, and a signal INP1 and a second data signal are changed when a first output signal applied to the high order bit counter circuit 2 is changed from a high level signal to a low level signal. That is, the linear burst sequence counter circuit is made to repeatedly perform 2-bit counting operation, outputs the first data signal and the second data signal to the low order bit counter circuit and the high order bit counter circuit, and thereby performs the linear burst sequence operation.

In addition, the present invention adds a high order bit counter circuit to the 2-bit linear burst sequence counter circuit, and can embody a multi-bit linear burst sequence counter circuit which is extended to the multi-bits.

As described above, the present invention can perform a stable counting operation in the device using the linear burst sequence operation, and can ensure a reliability and a stability of the device by using the above counter circuit.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:
1. A counter circuit for embodying a linear burst sequence, comprising:

a low order counting means receiving an external clock signal and an external counting control signal, counting a low order input signal, and generating a first data signal and a first high order control signal; and a high order counting means receiving the first high order control signal and the external counting control signal, counting a high order input signal, and generating a second data signal and a second high order control signal.

2. The counter circuit for embodying a linear burst sequence as set forth in claim 1, wherein the low order counting means includes:

a first control means which receives the clock signal and the counting control signal, controls a counting operation by combining the clock signal and the counting control signal, and outputs a third control signal and a fourth control signal for controlling the counting operation;

a first data input means which responds to the third control signal, receives the low order input signal, and generates a first input data; and a first output means which responds to the fourth control signal, counts the first input data from the first data input means, and outputs the first high order control signal for controlling the first data signal and the high order counting means.

3. The counter circuit for embodying a linear burst sequence as set forth in claim 2, wherein the first control means includes:

a first NAND gate which receives the clock signal and the counting control signal, performs a NAND operation signal, and outputs the second control signal.

4. The counter circuit for embodying a linear burst sequence as set forth in claim 2, wherein the first data input means includes:

a first switching means and a second switching means which respond to the third control signal and the external counting control signal, and output the first input data to the first output means.

5. The counter circuit for embodying a linear burst sequence as set forth in claim 2, wherein the first output means includes:

a third switching means which responds to the fourth control signal, and outputs the first input data generated from the first data input means;

a first storing means for storing the first input data from the first data input means;

a fourth switching means which responds to the fourth control signal, and outputs a fifth signal generated from the first storing means; and a second storing means for storing data generated from the fourth switching means.

6. The counter circuit for embodying a linear burst sequence as set forth in claim 1, wherein the high order counting means includes:

a second control means which receives the first high order control signal and the counting control signal, and outputs a sixth control signal and a seventh control signal for controlling the counting operation;

a second data input means which responds to the sixth control signal, receives the high order input signal, and generates a second input data; and a second output means which responds to the seventh control signal, counts the second input data applied from the second data input means, and outputs the second high order control signal.

7. The counter circuit for embodying a linear burst sequence as set forth in claim 6, wherein the second control means includes:

a first NAND gate which receives the first high order control signal and the counting control signal, performs a NAND operation about the first high order control signal and the counting control signal, and outputs the sixth control signal.

8. The counter circuit for embodying a linear burst sequence as set forth in claim 6, wherein the second data input means includes:

a fifth switching means and a sixth switching means which respond to the sixth control signal and the external counting control signal, and output the second input data to the second output means.

9. The counter circuit for embodying a linear burst sequences as set forth in claim 6, wherein the second output means includes:

a seventh switching means which responds to the seventh control signal, and outputs the second input data generated from the second data input means;

a third storing means for storing the second input data from the second data input means;

an eighth switching means which responds to the seventh control signal, and outputs an eighth signal generated from the third storing means; and a fourth storing means for storing data generated from the eighth switching means.

* * * * *